United States Patent [19]

Immorlica, Jr.

[11] 4,174,982

[45] Nov. 20, 1979

[54] CAPLESS ANNEALING COMPOUND SEMICONDUCTORS

[75] Inventor: Anthony A. Immorlica, Jr., Thousand Oaks, Calif.

[73] Assignee: Rockwell International Corporation, El Segundo, Calif.

[21] Appl. No.: 803,501

[22] Filed: Jun. 6, 1977

[51] Int. Cl.[2] ............................................... C22F 1/02
[52] U.S. Cl. .................................... 148/13.1; 148/1.5; 148/20.3
[58] Field of Search ........................ 148/13.1, 20.3, 1.5

[56] References Cited
U.S. PATENT DOCUMENTS 4,002,505  1/1977  Bult ..................................... 148/20.3

Primary Examiner—R. Dean
Attorney, Agent, or Firm—L. Lee Humphries; Craig O. Malin

[57] ABSTRACT

A method is disclosed for capless annealing compound semiconductors such as ion-implanted GaAs semiconductors. The surface of the semiconductor to be protected during annealing is placed in loose physical contact with an inert material such as powdered graphite. The assembly is placed in a controlled atmosphere and heated to the annealing temperature where it is maintained until annealed. The semiconductor is cooled and then removed from the controlled atmosphere and inert material. In one embodiment, a volatile one of the elements in the compound is introduced into the inert material.

10 Claims, 3 Drawing Figures

CAPLESS ANNEALING COMPOUND SEMICONDUCTORS

BACKGROUND OF THE INVENTION

A. Field of the Invention

This invention relates to the field of semiconductors and particularly to the annealing of semiconductor compounds.

B. Description of the Prior Art

Ion implantation is a technique used to dope selected areas of semiconductors such as GaAs. After ion implantation, the GaAs must usually be annealed at temperatures of 600° to 900° C. in order to anneal out the radiation damage produced during implantation and to activate the implanted dopant atoms. GaAs tends to dissociate by losing As at temeratures above about 600° C. In order to perform the required post implantation annealing of implanted GaAs without deterioration of the material due to this dissociation, it is necessary to find some method of preventing the dissociation. The technique usually applied involves deposition of a protective layer or cap using materials such as silicon dioxide or silicon nitride. Such caps can be sputtered or evaporated onto the semiconductor to form a dielectric cap which prevents dissociation of the crystal due to evaporation of the more volatile species during annealing.

Unfortunately, the doping results obtained by ion implantation is critically dependent upon the choice of the cap material and the method of its deposition. Problems with the adherance of these cap layers are often encountered. Both bubbling and rupturing of caps have been reported. In the prior art, the ability to employ implantation in the fabrication of devices in GaAs depends strongly upon being able to deposit a suitable capping material in a reproducible manner.

A cap introduces stress into the semiconductor because of the difference in thermal expansion between the cap and the semiconductor which it covers. Additionally, the presence of a cap provides a medium into which the implanted dopant may diffuse during annealing. Further, the application and removal of the cap after annealing creates additional problems, particularly for semiconductors having extensive circuits and layers of dielectric on their surface.

SUMMARY OF THE INVENTION

It is an object of the invention to provide an improved method for annealing compound semiconductors.

It is an object of the invention to provide a method for annealing compound semiconductors which method does not require forming a cap on the semiconductors.

It is an object of the invention to provide a method for annealing ion-implanted compound semiconductors which method protects the semiconductors while removing the lattice damage caused by collision processes and activating the implanted species.

According to the invention, the surface of the semiconductor to be protected during annealing is placed in loose physical contact with an inert material such as powdered graphite. The assembly is placed in a controlled atmosphere and heated to the annealing temperature where it is maintained until annealed. The semiconductor is cooled and then removed from the controlled atmosphere and inert material. In one embodiment, a volatile one of the elements in the compound is placed in proximity to the inert material.

These and other objects and features of the present invention will be apparent from the following detailed description, taken with reference to the accompanying drawings.

BRIEF DESCRIPTION OF THE DRAWINGS

FIG. 2a is a substrate annealed in $H_2$ without any surface protection; and

FIG. 2b is a substrate annealed according to the invention;

DESCRIPTION OF THE PREFERRED EMBODIMENT

Figure 1:
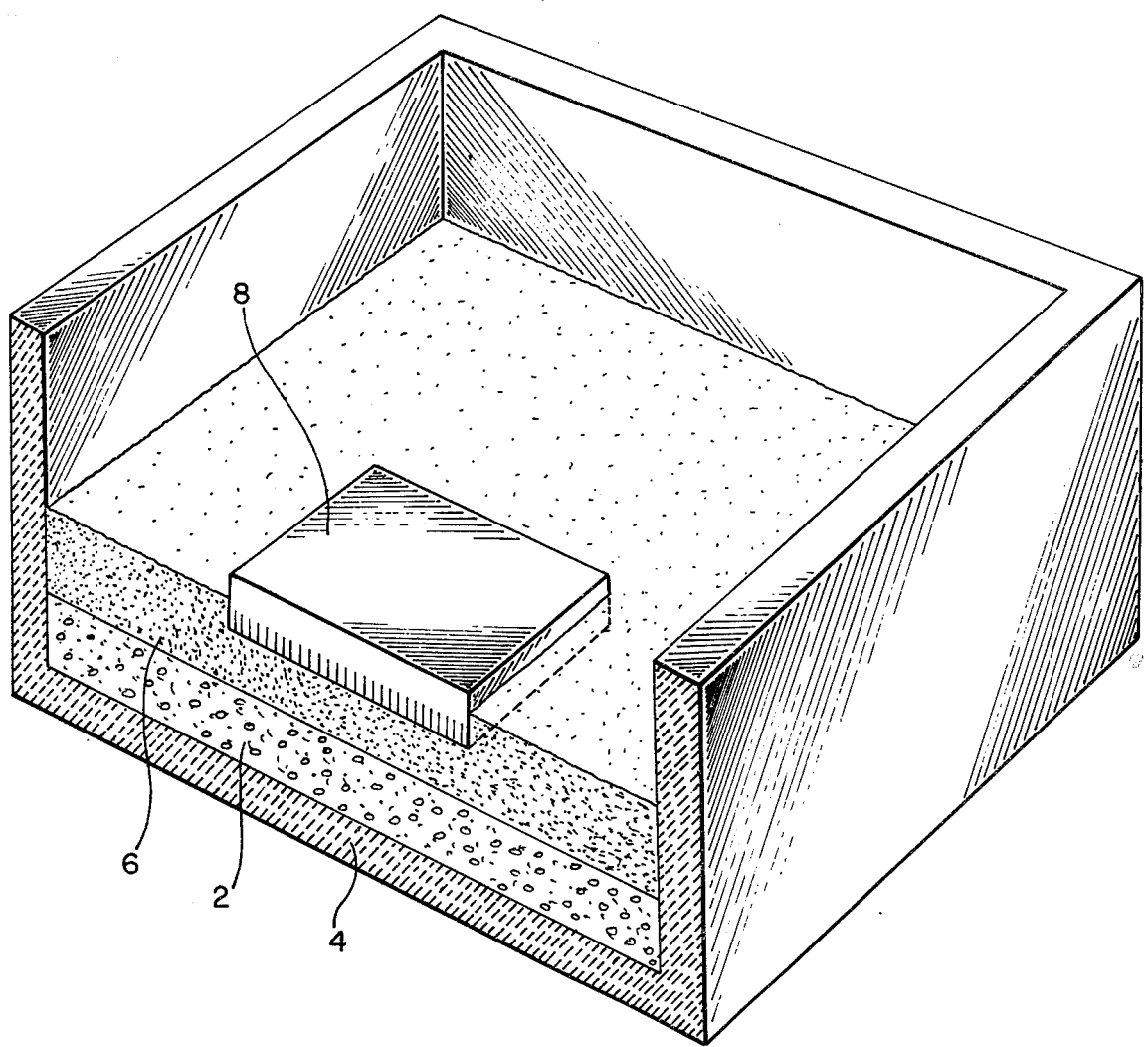
FIG. 1 is a perspective of a cross-section taken through a boat assembled with a semiconductor ready for annealing according to the invention.

FIG. 1 is a cross-section of an assembly for practicing the invention when the semiconductor being annealed has a very volatile component such as arsenic in a GaAs semiconductor. A layer 2 of crushed GaAs is spread in the bottom of a high purity graphite boat 4. A second layer 6 is finely pulverized graphite powder is spread over the GaAs layer. The GaAs wafer 8 being annealed is embedded in the graphite powder 6. As shown in FIG. 1, the ion-implanted face of the wafer 8 is embedded face down in the graphite powder 6. If it is desired to protect both sides of the wafer 8, it can be completely covered by the graphite powder.

The surface of the wafer to be protected is thus placed in loose physical contact with the inert graphite powder. Because there is no bond between the powder and the semiconductor, the two materials can expand and contract freely during the annealing cycle without inducing stresses into the wafer. Further, the graphite powder can be easily removed from the wafer without affecting the surface of the semiconductor.

It has been found that graphite powder having a 1 micron particle size will provide good coverage of the wafer's surface. While larger particle sizes can be used, the particles must not be so large as to provide openings between them which permit a large amount of volatile components to escape from the semiconductor.

Prior to first use of the boat with its crushed GaAs and graphite powder, it should be baked in a controlled atmosphere, generally an inert or reducing gas such as $H_2$, He, Ar, $N_2$, at a high temperature for a period of time (for example, 850° C. for 10 hours) to drive out adsorbed $O_2$ and $H_2O$. It is believed that this baking cycle also saturates the graphite powder with the volatile As from the layer of crushed GaAs.

After baking, the wafer to be annealed is placed face down in the powder and pressed slightly to compress the powder. This is done quickly to minimize exposure of the powder to the air. The boat is loaded into a furnace, the atmosphere evacuated, and the boat heated slowly to 100° to 200° C. to drive out adsorbed $O_2$ and $H_2O$. It is then backfilled with flowing palladium-purified hydrogen and heated to the annealing temperature (generally in the range of 600° to 900° C.) where it is held for a suitable time such as 30 minutes. The semiconductor is then cooled to about room temperature in the protective atmosphere before it is removed from the boat.

A variation of the above-described process has also proven successful for annealing GaAs substrates. According to this second embodiment, crushed GaAs is omitted from the boat and only graphite powder is used. Dissociation of the substrate is limited by an overpressure of As in the confining matrix of graphite particles.

In some cases, annealing can be accomplished by placing the surface to be protected in contact with an inert slab such as graphite. To obtain satisfactory and uniform results, the mating surfaces of the semiconductor and slab must be in intimate contact throughout their area. Such problem does not exist when graphite powder is used because the powder conforms to the semiconductor surface when the semiconductor is pressed into it.

Figure 2:
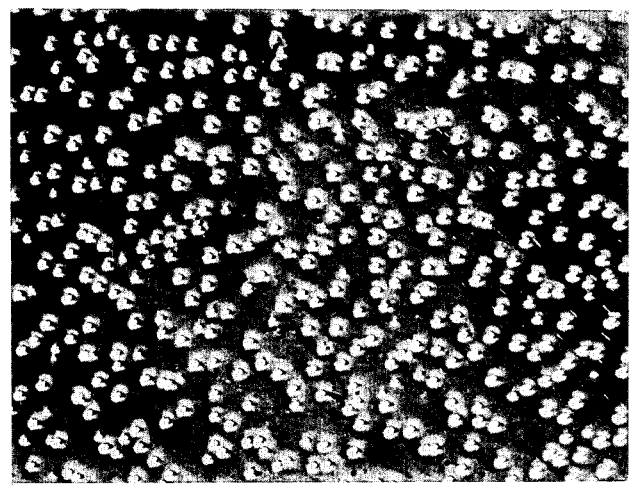
FIG. 2 is a comparison of the surface morphology of two similar GaAs substrates at about 280×.
Figure 2:
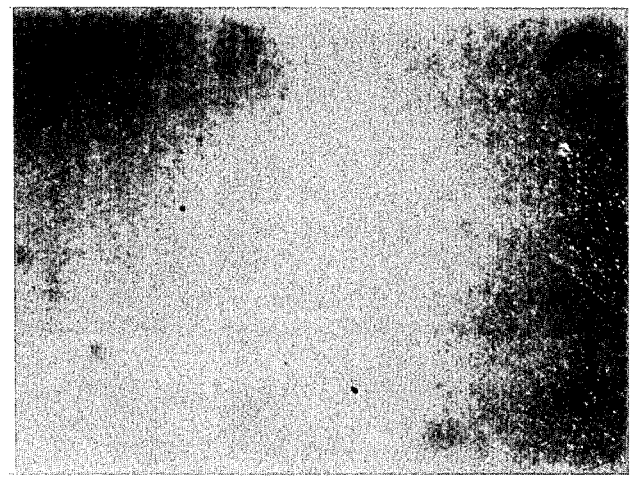

FIG. 2 compares the surface morphology of two identical Cr-doped semiconducting GaAs substrates which were heated together in the same annealing cycle. The substrate shown in FIG. 2a was positioned face up on a graphite platform and exposed to a $H_2$ atmosphere for 30 minutes at 850° C. Severe dissociation of the unprotected surface is apparent from the Ga droplets 10 which form due to a large loss of As from the crystal.

The substrate shown in FIG. 2b was annealed face down in graphite powder as shown in FIG. 1. The protected surface shows no discernable morphological features even when examined using high-magnification phase contrast microscopy.

The results presented in FIG. 2 indicate that there is very little evaporation of As from the surface of the sample which was annealed in the powdered graphite. It is probable that this occurs because a local As overpressure is maintained near the surface of the crystal by the graphite powder which prevents As from being swept away in the $H_2$ gas stream. Both the semiconductor crystal itself and the As which evaporates from the pulverized GaAs underlying the powdered graphite can serve as a source of the As overpressure. As discussed earlier, the invention covers both embodiments wherein only an inert cover is provided or an inert cover together with an additional source of the volatile semiconductor element is provided.

Figure 3:
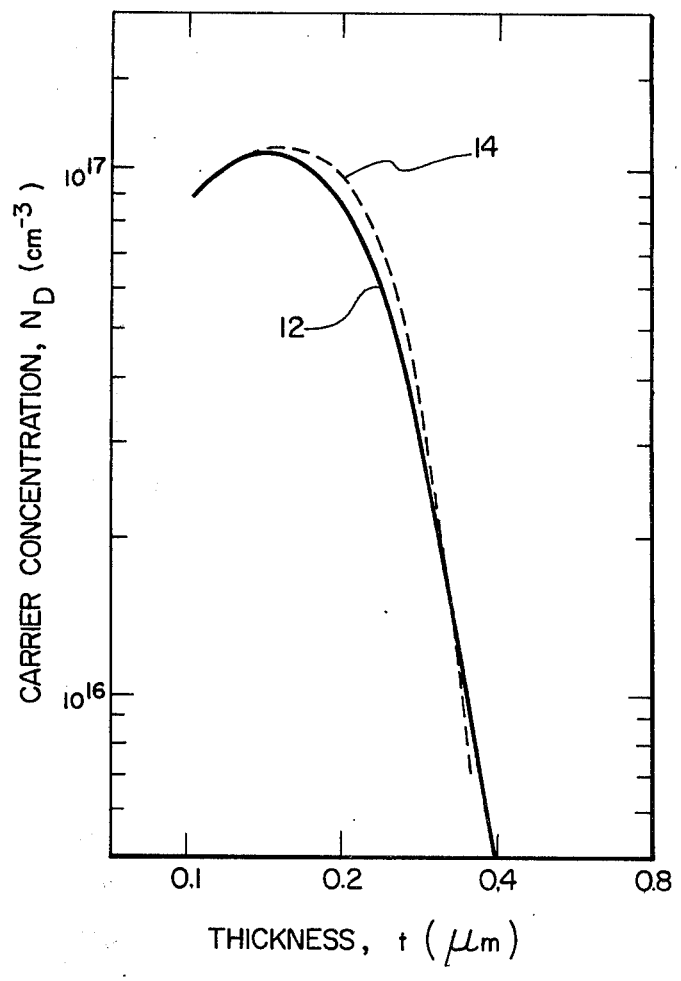
FIG. 3 shows the doping profiles of an implanted GaAs semiconductor annealed with a cap (prior art) and capless (present invention).

The electrical performance of semiconductors annealed according to the invention (capless anneal) is comparable to the results obtained using prior art cap anneals, as shown in FIG. 3. Curve 12 is the doping profile of a Se implanted GaAs semiconductor annealed with a silicon nitride cap. Curve 14 is the profile of an identically doped semiconductor annealed according to the capless technique. Both these curves agree well with the profile predicted from theoretical analysis.

While the invention has been described with respect to annealing GaAs semiconductors, it is clearly applicable to annealing any compound semiconductor where volatilization of one or more elements in the compound is a problem. Examples of such compounds include InP, GaSb, InAs, GaInAs, PbSnTe, and HgCdTe.

Likewise the invention is applicable to using many inert, protective materials other than the graphite powder and slabs described in the preferred embodiment. The word inert as used in the context of the invention means the lack of any detrimental reaction between the inert material and the semiconductor being annealed. It is within the skill of the artisan to select suitable inert materials for use with particular semiconductor compound being used. Such inert materials can be selected from a group including but not limited to C, $SiO_2$, $Si_3N_4$, AlN, and $Al_2O_3$.

Similarly, the addition of material to the boat load to provide an overpressure of the volatile element or elements can be determined by the artisan. Crushed semiconductor compound of the type being annealed will supply the volatile element. However, in some cases it may may be desirable to supply the element directly or in the form of some other compound. As previously described, some semiconductors under some annealing conditions are sufficiently protected by the inert powder. The necessity and suitability of adding volatile elements to the boat load for a particular annealing operation can be readily determined by running a sample and checking the quality of the surface obtained.

Numerous variations and modifications may be made without departing from the present invention. Accordingly, it should be clearly understood that the form of the present invention described above and shown in the accommpanying drawings is illustrative only and is not intended to limit the scope of the present invention.

What is claimed is:

1. A method of annealing a compound semiconductor comprising:
    placing an inert solid material in loose physical contact with a surface of the semiconductor to be protected;
    placing said inert material and semiconductor in a controlled atmosphere;
    heating said semiconductor to an annealing temperature;
    maintaining said semiconductor at said annealing temperature to anneal said semiconductor;
    cooling said semiconductor; and
    removing said semiconductor from said controlled atmosphere and from said inert material.

2. The method as claimed in claim 1, wherein said inert material comprises powdered graphite.

3. The method as claimed in claim 1, wherein said controlled atmosphere comprises a reducing gas.

4. The method as claimed in claim 1, wherein said controlled atmosphere comprises an inert gas.

5. The method as claimed in claim 1, wherein said controlled atmosphere comprises hydrogen.

6. The method as claimed in claim 1, wherein said step of placing said inert material and semiconductor in a controlled atmosphere, comprises:
    evacuating the atmosphere from around said inert material;
    backing said inert material to drive out $O_2$ and $H_2O$;
    backfilling controlled atmosphere around said inert material; and
    maintaining a flow of said controlled atmosphere around said inert material.

7. The method as claimed in claim 1, wherein said inert material is selected from the group consisting of C, $SiO_2$, $Si_3N_4$, AlN, and $Al_2O_3$.

8. The method as claimed in claim 4, wherein said inert material is in the form of a powder.

9. The method as claimed in claim 1, including the step of placing additional semiconductor material of the type being annealed in the proximity of said inert matrial.

10. A method of annealing a semiconductor, comprising:
    placing crushed GaAs and powdered graphite in a container;

placing the semiconductor in said container so that a surface of the semiconductor is in loose physical contact with said powdered graphite;

placing the semiconductor, said crushed GaAs, and said powdered graphite in an atmosphere of flowing hydrogen;

heating the semiconductor to an annealing temperature in the range of 600° to 900° C.;

maintaining the semiconductor at said annealing temperature to anneal the semiconductor;

cooling the semiconductor; and removing the semiconductor from said hydrogen atmosphere and from said container and said powdered graphite.

* * * * *